United States Patent [19]

Sharper

[11] Patent Number: 4,544,916
[45] Date of Patent: Oct. 1, 1985

[54] DIGITAL CODE TRANSLATOR

[75] Inventor: Craig A. Sharper, Haverhill, Mass.

[73] Assignee: AT&T Bell Laboratories, Murray Hill, N.J.

[21] Appl. No.: 413,470

[22] Filed: Aug. 31, 1982

[51] Int. Cl.[4] .............................. H04L 3/00
[52] U.S. Cl. ................. 340/347 DD; 375/30
[58] Field of Search ......... 340/347 DD; 235/310, 235/311; 375/30

[56] References Cited

U.S. PATENT DOCUMENTS

| | | | |
|---|---|---|---|
| 3,789,392 | 1/1974 | Candiani | 377/45 X |
| 3,798,635 | 3/1974 | Candiani | 340/347 DD |
| 3,945,002 | 3/1976 | Duttweiler et al. | 340/347 DD |
| 4,037,226 | 7/1977 | Betts et al. | 340/347 DD |
| 4,040,049 | 8/1977 | Messerschmitt | 370/7 X |
| 4,191,858 | 3/1980 | Araseki | 375/122 X |

OTHER PUBLICATIONS

Members of the Technical Staff, Bell Telephone Laboratories, Inc., Transmission Systems for Communications, 12/1971, pp. 580–583.

*Primary Examiner*—T. J. Sloyan
*Attorney, Agent, or Firm*—Joseph A. Cameron

[57] ABSTRACT

The most significant bits of each input word of a linear PCM signal address a read-only memory (ROM). Stored at each ROM address is a table of instruction words, one instruction word for each bit in the output word. The instruction words direct a switch to select each bit for the output word from a choice of 1, 0, or an input bit. PCM compression according to a predetermined characteristic is implemented by instruction words which direct selection of the proper chord bits from 1 or 0 and the proper step bits from the input bits. A different compression characteristic may be implemented by a different set of stored instruction words. The instruction words also command selective bit inversion and selective inclusion of the bit in a parity check. Implementation of the translator with commercially available hardware is described.

7 Claims, 3 Drawing Figures

DIGITAL CODE TRANSLATOR

RELATED APPLICATIONS

The following applications, assigned to the assignee of this application, are being concurrently filed herewith.

Gaunt-Giammusso Broadband Transmission on Limited Bandwidth Digital Line application Ser. No. 413,469 filed Aug. 31, 1982, now U.S. Pat. No. 4,486,876

Sharper Alarm Immune Program Signal application Ser. No. 413,421 filed Aug. 31, 1982, now U.S. Pat. No. 4,488,295

BACKGROUND OF THE INVENTION

This invention is in the field of Digital Communications; it relates particularly to the translation of information from one digital form to another.

As digital communications proliferate, and more and more information is communicated via digital facilities, the need to change codes and formats to fit the facility also increases. In one notable example, a system for inserting broadband audio program signals into T carrier time slots, which is described in the Gaunt-Giammusso application referred to above, encodes samples of the program signal into 14-bit linear pulse code modulated (PCM) words in offset-binary form. The 14-bit words are then compressed into 11-bit PCM words in sign-magnitude form, the order of the bits is rearranged, and a parity bit is added to reflect parity over only certain, not all of the bits. In another example, the Federal Republic of Germany has proposed to CCITT in Contribution #109 to Study Group XV, May, 1982, another format for compressed 12-bit words for sound program signals. According to the German proposal, the 12-bit words are also made up of eleven PCM compressed code bits and one parity bit; the more significant bits are interleaved with the less significant bits, and parity is taken over only the five most significant bits.

While 8-bit compressed analog-to-digital encoders are common, 11-bit compressing encoders are not. Furthermore, in some cases, such as the Gaunt-Giammusso arrangement, an unusual compression characteristic is required. Fourteen or fifteen bit linear encoders, on the other hand, are easily purchased, and the resulting output words can be compressed by a digital code translator.

It is well-known in the art to translate from one code to another by means of a memory look-up table. Each possible input code word forms an address of a read-only memory (ROM). Stored at the address is the translated output code word. In the case of a 14-bit input code, however, such a scheme requires $2^{14}$ memory addresses. With 12 bits per output word, the total memory requirement would be $2^{14} \times 12 = 196,608$ bits of memory, a rather large amount. Other available translation methods involve the use of logic circuitry. For very simple translations, available logic chips can be applied, but more complicated translators require considerable design effort and often custom logic integrated circuits. Unless contemplated production is very high volume, such expenditure may not be warranted.

An object of this invention is an inexpensive digital code translator that can convert linearly encoded PCM words to compressed PCM words.

Another object is a digital code translator that can perform compression, selective bit inversion, bit order rearrangement and selective parity inclusion.

A third object is a code translator that can be assembled from readily available parts.

A fourth object is a code translator the output format of which can be entirely changed by a mere change of the contents of a memory.

SUMMARY OF THE INVENTION

In this digital code translator for reversibly translating an input word into an output word, a first predetermined selection of bits of the input word addresses a memory. Stored at each such address is a table of instruction words. A bit selection switch chooses each bit of the output word from a choice of "1", zero or any one of a second predetermined selection of bits of the input word, according to a respective instruction word. Bit inverting means and parity switch means, both also responsive to the instruction words may be added to provide selective inversion of individual bits and selective inclusion in a parity check of individual bits.

DETAILED DESCRIPTION

Figure 1:
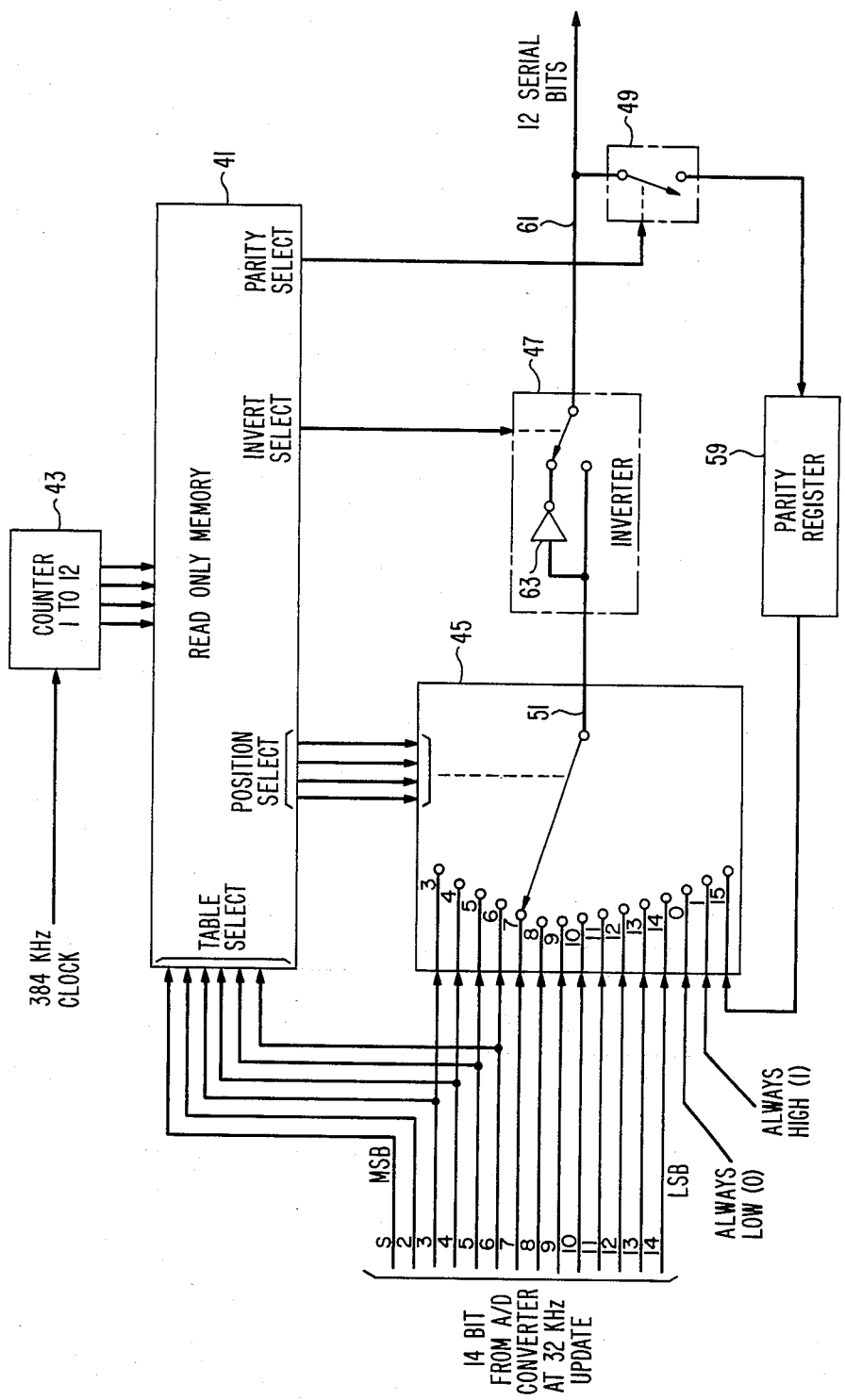
FIG. 1 is a functional block diagram of an embodiment of the invention.

To explain the invention in detail, I refer now to FIG. 1, which is a functional block diagram of an embodiment of the invention. This embodiment will be described in connection with the translation of 14-bit linear PCM words into 12-bit compressed PCM words at a 32kHz rate, although the invention is not, of course, limited to such use.

In FIG. 1 a read-only memory (ROM) 41 is addressed by the six most significant bits of the 14-bit linear input word. At each of the sixty-four possible addresses of memory 41 is stored a table of twelve instruction words. A 1 to 12 counter 43 addresses the twelve table entries in order, under control of a 384kHz clock. The table of twelve stored instruction words is therefore read out in order in response to each 14-bit input word, which may be representative of a single analog sample.

Four bits of each output word of memory 41 address a bit selection switch 45; one bit addresses an inverter switch 47, and one bit addresses a parity switch 49. Bit selection switch 45 operates to selectively connect its output 51 to one of its inputs 0 through 15 under control of each output instruction word from memory 41. The inputs of switch 45 include the third through fourteenth bits of the linear input word, an always low (zero) input 0, an always high (1) input 1 and the output 15 of a parity register 59. Inverter switch 47 selectively connects bit selector output 51 to code translator output 61 directly, or alternatively through an inverter 63. Parity switch 49 selectively connects code translator output 61 to the input of a parity register 59. In response to each 14-bit encoded sample input, therefore, ROM 41 utters twelve instruction words of six bits each. Each instruction word determines one output bit of the 12-bit compressed output word, whether that bit is inverted, and whether it is included in the parity check.

The ability to select one bit at a time from a choice of 1, 0 or a particular input bit allows compression to any characteristic. Consider, for example, the translation of Table 1.

TABLE 1

| 14-BIT LINEAR | | 11-BIT COMPRESSED | | |
|---|---|---|---|---|
| SIGN | MAGNITUDE | SIGN | CHORD | STEP |
| S | 0 0 0 0 0 0 ABCDEFG | S | 000 | ABCDEFG |
| S | 0 0 0 0 0 1 ABCDEFG | S | 001 | ABCDEFG |
| S | 0 0 0 0 1 ABCDEFG - | S | 010 | ABCDEFG |
| S | 0 0 0 1 ABCDEFG - - | S | 011 | ABCDEFG |
| S | 0 0 1 ABCDEFG - - - | S | 100 | ABCDEFG |
| S | 0 1 ABCDEFG - - - - | S | 101 | ABCDEFG |
| S | 1 ABCDEFG - - - - - | S | 110 | ABCDEFG |

The 11-bit compressed column is made up of the sign bit S, three chord bits, and seven step bits A through G. Bits represented by dashes in the 14-bit linear column are discarded. As the magnitude of the signal increases, more bits are discarded, indicating coarser steps.

Figure 2:
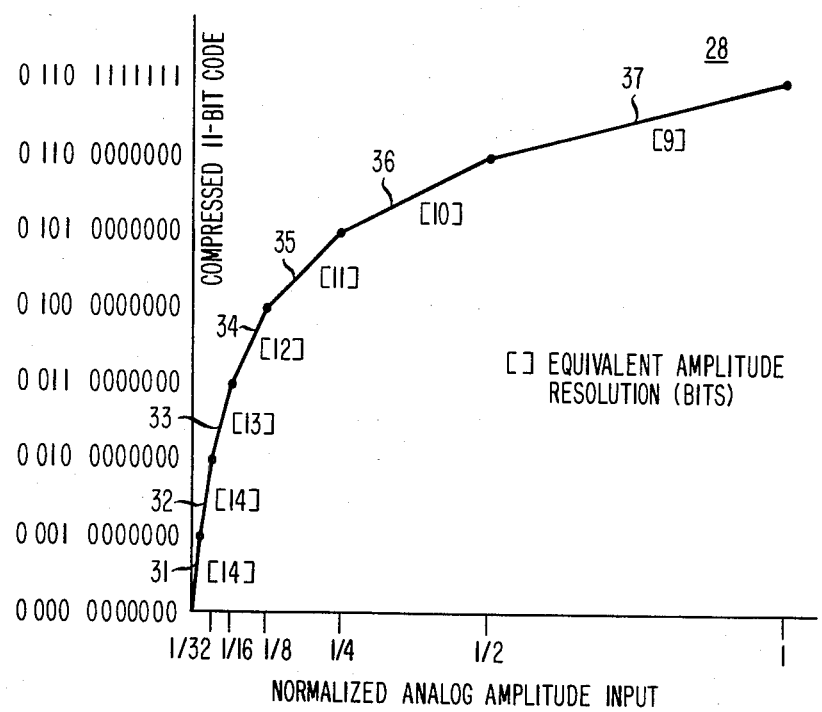
FIG. 2 is a compression characteristic useful in explaining the operation of the invention.

By the implementation of Table 1, the translator accomplishes the compression illustrated in FIG. 2. Characteristic 28 of FIG. 2 is made up of 7 linear chords, 31 through 37, respectively, each identified by three chord bits. Although only the positive half of compression characteristic 28 is shown according to custom, it is understood that the negative half is symmetrical to that shown but lying in the third quadrant. Corresponding third quadrant chords, therefore, are identified by the same chord bits but the opposite sign bit. Each segment is further divided by seven bits defining $2^7$, i.e., 128 steps. A positive sample of magnitude greater than ½ maximum, therefore, is encoded by chord 37 into an 11-bit word, the first 4 bits of which are 0110. The last line of Table 1 shows the translation of the 14-bit linear representation of this magnitude to the same 11-bit compressed code word. Similarly, a negative sample of less than 1/64th maximum magnitude is encoded according to chord 31 (with an equivalent resolution of 14 bits) the first four bits are 1000. This is implemented by the first line of Table 1. Digital translation to other compression characteristics involves similar chord identification and copying of the step bits.

The ability to invert any bit is useful in certain kinds of code conversion. If the digital input to code converter 24, for example, is in offset-binary form, the most negative analog value has been encoded as all zeros and the most positive value as all 1's. Translating this to a sign-magnitude compressed code requires that the most significant bit of all words be inverted to form the conventional sign bit. In addition, step bits must be inverted for negative signal samples to reflect negative increments from zero instead of positive increments. Chord bits, of course, are not inverted.

The parity check gives enough information to detect that one bit in a word is in error, but not enough information to determine which bit. The receiver, therefore, cannot correct the error but merely rejects the whole word representing one analog sample. If a more significant bit has changed, therefore, and a less significant bit is in error, ignoring the entire word introduces a greater error than using it. It is thus useful to take parity over only the most significant bits, ignoring the least significant.

The ability to select one bit at a time in response to an individual instruction word also allows bits to be assembled in the output word in any order.

A particularly useful format for 12-bit compressed words to be inserted into 8-bit time slots, as described in the Gaunt, Jr. et al, patent, uses following bit order: S F A B Z E X Y C G D P. In notation, S is the sign bit; X, Y and Z are the chord bits; A through G are the step bits, in order of decreasing significance; and P is a parity bit. The embodiment of FIG. 1 can assemble these words using the compression characteristic of FIG. 2 as follows:

The first instruction word instructs switch 45 to select the sign bit S by connecting its output 51 to either input 0 or 1. It also commands inverter switch 47 to connect input 51 directly to output 61, bypassing inverter 63, and switch 49 to connect parity register 59 to output 61 so that the sign bit is included in the parity check. In a similar manner, the second command word selects bit F. For this bit, output 51 is connected to one of inputs 8 through 13, depending upon the values of inputs S through 6, according to Table 1. If the input sign bit is zero, indicating in offset-binary code a negative sample, the F bit is inverted by switch 47 and the parity switch 49 is open. Chord bits X, Y and Z are selected by the seventh, eighth and fifth instruction words, respectively, from inputs 0 and 1. In a notable exception stored in the table select addresses 100000 and 011111, which represent the smallest magnitude signals in offset-binary code, the fifth instruction word selects chord bit Z by connecting selector output 51 to input 7. This results in the proper chord, according to Table 1, but saves half of the memory space. It is possible because chords 31 and 32 are co-linear. Assuming offset-binary input and sign-magnitude output, Table 2 illustrates twelve instruction words that may be stored at table select address 100000 to implement compression chord 31. It can readily be seen that no bits are inverted, that parity is taken over bits S X Y Z A B C P only, and that the Z bit is chosen from input 7. Including the parity bit in the calculation serves to reset it for the next sample. To complete the picture, Table 3 illustrates the instruction words that could be stored at ROM address 010101 (in offset-binary code) implementing chord 36 in the third quadrant. It can be seen that, according to Table 1, the least significant bit G of the output word is the tenth bit of the input word, that the seven step bits are inverted, and that, again, parity is taken over bits S X Y Z A B C P.

Since the make up of the output word is determined bit by bit by the instruction words stored in ROM 41, the embodiment of the invention shown in FIG. 1 is very versatile. An entirely different translation may be implemented by a simple change in the contents of the ROM. For example, if the input words are in sign-magnitude form, the first instruction word stored at each input address selects the same bit 1, or zero as the most significant bit of the address.

TABLE 2

| INSTRUCTION WORDS STORED AT ROM ADDRESS 100000 | | | | |
|---|---|---|---|---|
| | | | OUTPUT | |
| BIT | INPUT SELECT | ROM SELECT | INV | P |
| S | 0 | 0000 | 0 | 0 |
| F | 13 | 1101 | 0 | 1 |
| A | 8 | 1000 | 0 | 0 |
| B | 9 | 1001 | 0 | 0 |
| Z | 7 | 0111 | 0 | 0 |
| E | 12 | 1100 | 0 | 1 |
| X | 0 | 0000 | 0 | 0 |
| Y | 0 | 0000 | 0 | 0 |

TABLE 2-continued

INSTRUCTION WORDS STORED AT ROM ADDRESS 100000

| BIT | INPUT SELECT | ROM SELECT | OUTPUT INV | P |
|---|---|---|---|---|
| C | 10 | 1010 | 0 | 0 |
| G | 14 | 1110 | 0 | 1 |
| D | 11 | 1011 | 0 | 1 |
| P | 15 | 1111 | 0 | 0 |

TABLE 3

INSTRUCTION WORDS STORED AT ROM ADDRESS 010101

| BIT | INPUT SELECT | ROM SELECT | OUTPUT INV | P |
|---|---|---|---|---|
| S | 1 | 0001 | 0 | 0 |
| F | 9 | 1001 | 1 | 1 |
| A | 4 | 0100 | 1 | 0 |
| B | 5 | 0101 | 1 | 0 |
| Z | 1 | 0001 | 0 | 0 |
| E | 8 | 1000 | 1 | 1 |
| X | 1 | 0001 | 0 | 0 |
| Y | 0 | 0000 | 0 | 0 |
| C | 6 | 0110 | 1 | 0 |
| G | 10 | 1010 | 1 | 1 |
| D | 7 | 0111 | 1 | 1 |
| P | 15 | 1111 | 0 | 0 |

To change the output bit order, such as in the German suggestion to CCITT, the order of the words in the table is changed. Different compression characteristics require different words to chose the chord bits.

Even more drastic changes are relatively easy to design with the use of this invention. A different number of bits in the output word may require, for example, a different clock rate for reading out the instruction words as well as a different number of words in each table. Different length input words may require more memory addresses, and more chords in the compression characteristic may require more bits in the instruction words, but these design changes are all well within the ordinary skill of those in the art.

Figure 3:
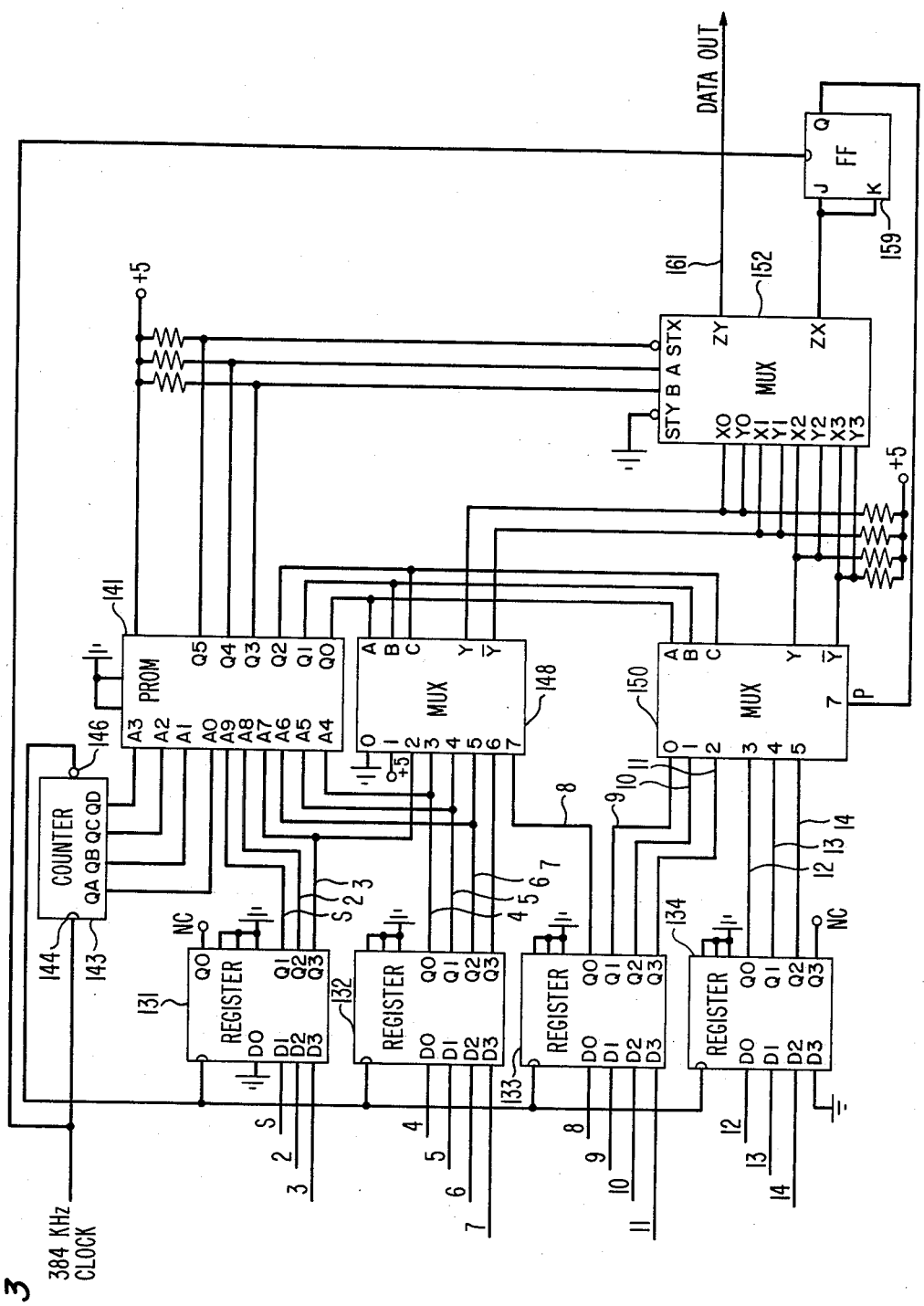
FIG. 3 is a schematic diagram of a particularly useful embodiment of the invention.

FIG. 3 is a schematic diagram of an embodiment of the invention utilizing commercially available integrated circuits. In this circuit, four 4-bit registers 131, 132, 33, and 134, respectively, each have four input leads, D0 through D3, four output leads, Q0 through Q3, and a clock input. The fourteen parallel outputs S through 14 from the analog-to-digital converter are connected to the D0 through D3 inputs of the four registers. Input D0 of register 131 may be connected to ground; for example, with the sign bit S connected to input D1, etc., and input D3 of register 134 may also be grounded. A 1 to 12 counter 143 has one input 144 connected to the 384kHz clock signal, four outputs, QA, QB, QC and QD, upon which appear the combinational logic that counts from 1 to 12, and a carry output 146. A programmable read-only memory (PROM) 141 has ten address inputs A0 through A9 and six outputs Q0 through Q5. Address inputs A0 through A3 are connected to counter 143 outputs QA through QD, respectively. Address inputs A9, A8 and A7 are connected to register 131 outputs Q1, Q2 and, Q3, respectively, and address inputs A4, A5 and A6 are connected to register 132 outputs Q0, Q1 and Q2, respectively. Counter carry output 146 is connected to the clock inputs of registers 131 through 134. Two 8 to 1 multiplexers 148 and 150, each have eight signal inputs 0 through 7, and three instruction inputs, A, B and C, and two outputs, Y and $\overline{Y}$. Signal input 1 of multiplexer 148 is connected to the +5 volt source. Input 0 is connected to ground, and input 2 is connected to output Q3 of register 131. Inputs 3, 4, 5 and 6 of multiplexer 148 are connected to outputs Q0 through Q3, respectively, of register 132, and input 7 is connected to output Q0 of register 133. Inputs 0, 1 and 2 of multiplexer 150 are connected to outputs Q1, Q2, and Q3, respectively, of register 133, and inputs 3, 4, 5 of multiplexer 150 are connected to outputs Q0, Q1 and Q2, respectively, of register 134. Instruction inputs A, B and C of both multiplexers 148 and 150 are connected to outputs Q0, Q1 and Q2, respectively, of PROM 141. A dual 4 to 1 multiplexer 152 has signal inputs X0, Y0, X1, Y1, X2, Y2, X3 and Y3, and instruction inputs A, B, STX and STY. Multiplexer 152 also has two outputs, ZY and ZX. Instruction inputs A and B of multiplexer 152 are connected to outputs Q4 and Q3, respectively, of PROM 141. Input STY is connected to ground, and input STX is connected to output Q5 of PROM 141. Signal inputs X0 and Y0 are connected to output Y of multiplexer 148 and signal input X1 and Y1 are connected to output $\overline{Y}$ of multiplexer 148. Similarly, signal inputs X2 and Y2 and X3 and Y3 are connected to multiplexer 150 outputs Y and $\overline{Y}$, respectively. Finally, the code converter of FIG. 3 includes a JK flip-flop 159 which performs as a parity register. Output ZX of multiplexer 152 is connected to the J and K inputs of flip-flop 159, the Q output is connected to input 7 of multiplexer 150, and the clock input is connected to the 384kHz clock signal.

In this specific implementation, registers 131 through 134 may be 4-bit registers in CMOS supplied, for example, by Motorola under the code MC14076. PROM 141 may be 1Kx8 capacity manufactured by Intel in NMOS under the code 2708. The particular words stored in the PROM, of course, will be determined by the logic signals required by the chosen integrated circuits to perform the functions described in connection with FIG. 1. Multiplexers 148 and 150 can be purchased in TTL logic from Texas Instruments, coded 74LS151, and multiplexer 152 may be Motorola's dual 4-1 multiplexer MC14539 manufactured in CMOS. Counter 143 can utilize the commonly available chip 74LS161 in TTL logic. While this chip is capable of counting to 16, it is easily wired by those skilled in the art to count to 12.

Since multiplexer 152 is implemented in CMOS technology, its inputs that interface with NMOS (PROM 141) and TTL (multiplexers 148 and 150) are connected to the +5 volt source through 10K pull-up resistors.

This circuit operates as follows: The four input registers 131 through 134 operate as a latch to hold in parallel form the 14-bit input words from the linear A to D converter. The first six bits, S through 6, form part of the address of PROM 141, the outputs of counter 143 form the remainder of the address. The address bits, therefore, on A0 through A3, step through 12 changes at the 384kHz rate, while those on leads A4 through A9 remain constant. The carry signal from counter 143 updates the 14-bit word as the counter resets. Twelve instruction words are, therefore, read out of PROM 141 on leads Q0 through Q6 for each input 14-bit word.

The outputs Y and $\overline{Y}$ of the multiplexers 148 and 150 are connected to specific inputs 0 through 7 according to the logic on the inputs A, B, and C; that is, the first three bits of each instruction word stored in PROM 141. $\overline{Y}$, of course, is the inverse of Y.

The chip chosen for multiplexer 152 operates in this manner: When inputs STX and STY are low, outputs ZX and ZY are connected to the particular respective X and Y inputs indicated by the logic on inputs A and B. With input STY grounded, therefore, output ZY is always connected to a selected Y input, Y0 through Y3. Output ZX is connected to the selected X input only when a 0 appears on STX. Thus, the first five bits of each instruction word chose a particular output bit and whether or not it is inverted. The sixth bit determines whether it is to be included in parity. The output Q of flip-flop 159 changes state with every "1 " from output ZX of multiplexer 152. It forms the parity bit, which is the last bit of each 12-bit word fed out of output 161.

I have thus described a digital code translator that is inexpensive to build, easy to design, and very versatile. It will be obvious that many other embodiments can be designed without departing from the principle and scope of the invention.

I claim:

1. A digital code translator for translating an input PCM word according to a predetermined compression characteristic into an output PCM word having chord bits and step bits, said translation comprising:

memory means (41, 141) having a multiplicity of addresses for storing at each said address a table of instruction words, address inputs (A4–A9) and instruction word outputs (Q0–Q5);

means connecting a first predetermined selection of bits of said input word to said address inputs;

selector switch means (45, 148, 150, 152) having instruction inputs connected to said instruction word outputs to receive said instruction words, a plurality of bits inputs (0–15), and a switch output (51, 161) for connecting a selected one of said plurality of bit inputs to said switch output according to an instruction word;

means connecting a source of potential representative of a "1" inputs;

means connecting a source o potential representative of a zero to a second one of said bit inputs; and means connecting a second predetermined selection of bits of said input word to others of said bit inputs, respectively;

respective instruction words of said tables directing said switch to select said chord bits from among said first and second ones of said bit inputs and to select said step bits from among said others of said bit inputs according to said predetermined compression characteristic to generate said output word.

2. A digital code translator, as in claim 1, wherein said first predetermined selection of bits of said input word comprises the six most significant bits.

3. A digital code translator as in claim 1, additionally comprising selective bit inversion means (47, 148, 150, 152) connected to at least one bit of said instruction word outputs (Q3 and Q4) and to said switch output for inverting according to said instruction words selected bits of said output word.

4. A digital code translator as in claim 1 or 3, additionally comprising parity register means (59, 159) having a parity output (Q) connected to a third one of said bit inputs (15, P) and an input (J. K); and parity switch means (49, 152) connected to said switch output, said parity register means input and one of said instruction word outputs (Q5) for selectively connecting said selector switch output to said parity register means according to said instruction words to include designated bits of said output word in a parity check.

5. A digital code translator, as in claim 1, wherein said memory means comprises a programmable read-only memory.

6. A digital code translator as in claim 1, further comprising digital counting means (43, 143) for cyclically counting the number of bits in said output word, having a plurality of count outputs connected to said memory means to individually address the words of said tables of stored instruction words and a clock input connected to a source of clock pulses; said counting means advancing one word in a table in response to each clock pulse.

7. a digital code translator as in claim 3, for translating an offset binary code into a compressed sign-magnitude code wherein said at least one bit of said instruction words causes said inverter means to invert each of said step bits.

* * * * *

UNITED STATES PATENT AND TRADEMARK OFFICE
CERTIFICATE OF CORRECTION

PATENT NO. : 4,544,916

DATED : October 1, 1985

INVENTOR(S) : Craig A. Sharper

It is certified that error appears in the above-identified patent and that said Letters Patent is hereby corrected as shown below:

(col 7)　　line 24　　"translation" should be
　　　　　　　　　　　　--translator--

(col 7)　　lines 38 and 39 should read
　　　　　　　　　　　　--means connecting a source of potential
　　　　　　　　　　　　　representative of a "1" to a first one
　　　　　　　　　　　　　of said bit inputs;--

Signed and Sealed this

Seventh Day of June, 1988

Attest:

DONALD J. QUIGG

*Attesting Officer*　　　　　*Commissioner of Patents and Trademarks*